US012520461B2

United States Patent
Reitinger et al.

(10) Patent No.: US 12,520,461 B2
(45) Date of Patent: Jan. 6, 2026

(54) POWER ELECTRONICS MODULE FOR ELECTRIC VEHICLE

(71) Applicant: LiveWire EV, LLC, Milwaukee, WI (US)

(72) Inventors: Samuel Nicholas Reitinger, Wauwatosa, WI (US); Christian Handley, San Francisco, CA (US)

(73) Assignee: LiveWire EV, LLC, Milwaukee, WI (US)

( * ) Notice: Subject to any disclaimer, the term of this patent is extended or adjusted under 35 U.S.C. 154(b) by 330 days.

(21) Appl. No.: 18/189,465

(22) Filed: Mar. 24, 2023

(65) Prior Publication Data

US 2024/0324149 A1    Sep. 26, 2024

(51) Int. Cl.
| | |
|---|---|
| *H05K 7/20* | (2006.01) |
| *B60L 50/61* | (2019.01) |
| *B60L 50/64* | (2019.01) |
| *B60L 53/16* | (2019.01) |
| *B60L 53/302* | (2019.01) |
| *B60K 11/02* | (2006.01) |

(52) U.S. Cl.
CPC .......... *H05K 7/20872* (2013.01); *B60L 50/61* (2019.02); *B60L 50/64* (2019.02); *B60L 53/16* (2019.02); *B60L 53/302* (2019.02); *H05K 7/20927* (2013.01); *B60K 11/02* (2013.01); *B60L 2200/12* (2013.01); *B60L 2210/30* (2013.01)

(58) Field of Classification Search
CPC ............ H05K 7/20872; H05K 7/20927; B60L 50/61; B60L 50/64; B60L 53/302; B60L 53/16; B60L 2200/12; B60L 2210/30; B60K 11/02

USPC .......................................................... 361/699
See application file for complete search history.

(56) References Cited

U.S. PATENT DOCUMENTS

| | | | | |
|---|---|---|---|---|
| 5,504,378 A | * | 4/1996 | Lindberg ........... | H05K 7/20927 361/699 |
| 5,531,285 A | * | 7/1996 | Green ...................... | B60K 6/48 165/41 |
| 6,313,991 B1 | * | 11/2001 | Nagashima ......... | B60R 16/0239 174/16.3 |
| 6,404,628 B1 | * | 6/2002 | Nagashima ........ | H05K 7/20927 174/547 |
| 8,342,276 B2 | * | 1/2013 | Murakami .............. | B60L 58/40 361/698 |

(Continued)

OTHER PUBLICATIONS

European Patent Office Extended Search Report for Application No. 24165138.9 dated Sep. 3, 2024 (9 pages).

*Primary Examiner* — Anatoly Vortman
(74) *Attorney, Agent, or Firm* — Michael Best & Friedrich LLP

(57) ABSTRACT

A power electronics module for an electric vehicle includes a housing and a charger circuit including a circuit board with a plurality of electronic components on a first side of the housing. A motor controller circuit including a circuit board with a plurality of electronic components is provided on a second side of the housing. A cooling plate is provided in the housing and sandwiched between the inverter of the motor controller circuit on a first side of the cooling plate and the plurality of electronic components of the charger circuit on a second side of the cooling plate opposite the first side.

10 Claims, 7 Drawing Sheets

(56) References Cited

U.S. PATENT DOCUMENTS

| | | | | |
|---|---|---|---|---|
| 8,811,015 B2* | 8/2014 | Wagner | ................. | G06Q 30/02 |
| | | | | 361/689 |
| 8,863,869 B2* | 10/2014 | Nakatsu | ............ | H05K 7/14322 |
| | | | | 361/689 |
| 9,007,767 B2* | 4/2015 | Nakajima | ............ | H02M 7/003 |
| | | | | 165/80.4 |
| 11,191,191 B2* | 11/2021 | Krippner | ............ | H05K 7/2039 |
| 2010/0097765 A1* | 4/2010 | Suzuki | ................... | B60K 6/405 |
| | | | | 361/699 |
| 2010/0326750 A1* | 12/2010 | Murakami | ........... | H01L 25/072 |
| | | | | 165/185 |
| 2011/0051371 A1* | 3/2011 | Azuma | ................ | B60W 10/08 |
| | | | | 361/699 |
| 2011/0116235 A1* | 5/2011 | Ryu | ....................... | B60L 58/10 |
| | | | | 361/699 |
| 2013/0105120 A1* | 5/2013 | Campbell | .............. | H05K 7/203 |
| | | | | 165/104.21 |
| 2013/0215573 A1* | 8/2013 | Wagner | ............. | G06Q 30/0629 |
| | | | | 361/702 |
| 2014/0178736 A1* | 6/2014 | Gandhi | .............. | H01M 50/209 |
| | | | | 429/120 |
| 2014/0339009 A1 | 11/2014 | Suzuki et al. | | |
| 2019/0394908 A1* | 12/2019 | Birdeanu | ........... | H05K 7/20272 |
| 2020/0031420 A1 | 1/2020 | Aunkst et al. | | |
| 2022/0203816 A1 | 6/2022 | Lu et al. | | |
| 2023/0300997 A1* | 9/2023 | Wenk | .................... | B60K 11/02 |
| | | | | 361/699 |

* cited by examiner

POWER ELECTRONICS MODULE FOR ELECTRIC VEHICLE

BACKGROUND

The present invention relates to rechargeable electric vehicles, including among other things motorcycles. Such vehicles have one or more electric motors driven by power electronics from energy stored in an on-board battery pack for locomotion of the vehicle. During times of non-use, the battery pack can be recharged by plugging into an external power source (e.g., AC grid power) via a charger and charge port.

SUMMARY

In one aspect, the invention provides power electronics module for an electric vehicle, the power electronics module comprising a housing and a charger circuit including a circuit board with a plurality of electronic components on a first side of the housing. The charger circuit includes an AC input configured for connection with a charge port of the electric vehicle and a DC output configured for connection with a rechargeable battery of the electric vehicle. A motor controller circuit including a circuit board with a plurality of electronic components is provided on a second side of the housing. The motor controller circuit includes a DC input configured for connection with the rechargeable battery, an inverter, and an AC output configured for connection with an electric traction motor of the electric vehicle. A cooling plate is provided in the housing, and the cooling plate is sandwiched between the inverter of the motor controller circuit on a first side of the cooling plate and the plurality of electronic components of the charger circuit on a second side of the cooling plate opposite the first side In another aspect, the invention provides an electric vehicle including a battery pack including a plurality of rechargeable electrochemical cells. An electric motor is connected to receive stored energy from the plurality of rechargeable electrochemical cells, the electric motor having an output connected to drive a wheel of the vehicle. A charge port of the electric vehicle is configured for connection with an external power source. A power electronics housing encloses an inverter for driving the electric motor and charging electronics for managing charging power from the charge port to the battery pack. A cooling channel is at least partially defined by a cooling plate within the power electronics housing, the cooling channel extending between a first coolant inlet and a first coolant outlet. The cooling channel has a first portion positioned along the inverter to draw heat from the inverter, and the cooling channel has a second portion positioned along the charging electronics to draw heat from the charging electronics.

In yet another aspect, the invention provides an electric vehicle comprising a battery pack including a plurality of rechargeable electrochemical cells received within an internal cell cavity of a battery case. An electric motor is connected to receive stored energy from the plurality of rechargeable electrochemical cells, the electric motor having an output connected to drive a wheel of the vehicle. A power electronics module separate from the battery pack defines a liquid coolant flow path from a cold side of a radiator into a housing of the power electronics module via a first coolant inlet, from the first coolant inlet through a cooling channel that extends between motor control electronics on a first side and battery charger electronics on a second side opposite the first side, from the cooling channel out of the housing via a first coolant outlet to an external loop including a coolant pump and the electric motor, from the external loop back into the housing via a second coolant inlet, from the second coolant inlet through a hot coolant return passage that is offset from the cooling channel, and out a second coolant outlet to a hot side of the radiator.

DETAILED DESCRIPTION

Before any aspects of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
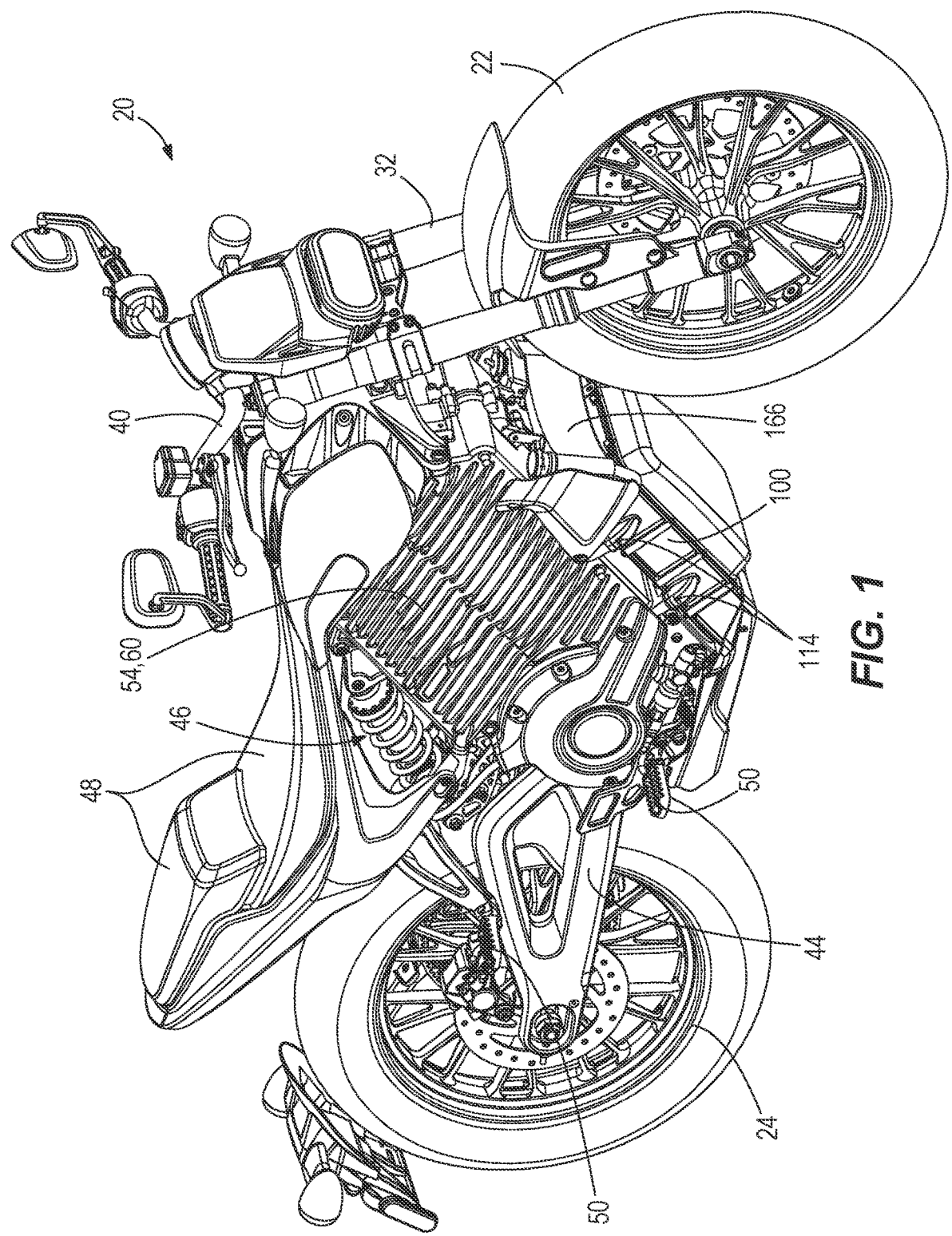
FIG. 1 is a right side perspective view of a motorcycle according to one embodiment of the present disclosure.

FIG. 1 illustrates an electric vehicle in the form of a motorcycle 20 according to one embodiment of the present disclosure. The motorcycle 20 includes front and rear wheels 22, 24 (e.g., a single front wheel 22 and a single rear wheel 24 aligned with the front wheel 22 to define a single track). The motorcycle 20 includes a frame structure devoid of a conventional main frame. A front fork 32 supports the front wheel 22 and allows rotation of the front wheel 22 along the road surface. The front fork 32 is rotatably coupled to a head tube (not shown) of the frame for steering control of the front wheel 22. Handlebars 40 are coupled to the front fork 32 to allow a rider to control the orientation of the front fork 32 and the front wheel 22. A rear swingarm 44 supports the rear wheel 24 for rotation therein, the rear swingarm 44 enabling pivoting suspension movements of the rear wheel 24 and the swingarm 44 together. In addition to the pivoting support, the swingarm 44 is supported by a shock absorber unit 46 (e.g., including a coil spring and a hydraulic damper). The motorcycle 20 further includes at least one seat 48 (e.g., saddle seat(s) for operator and optionally pillion passenger) and at least one set of foot supports 50 (e.g., laterally extending foot pegs).

Figure 2:
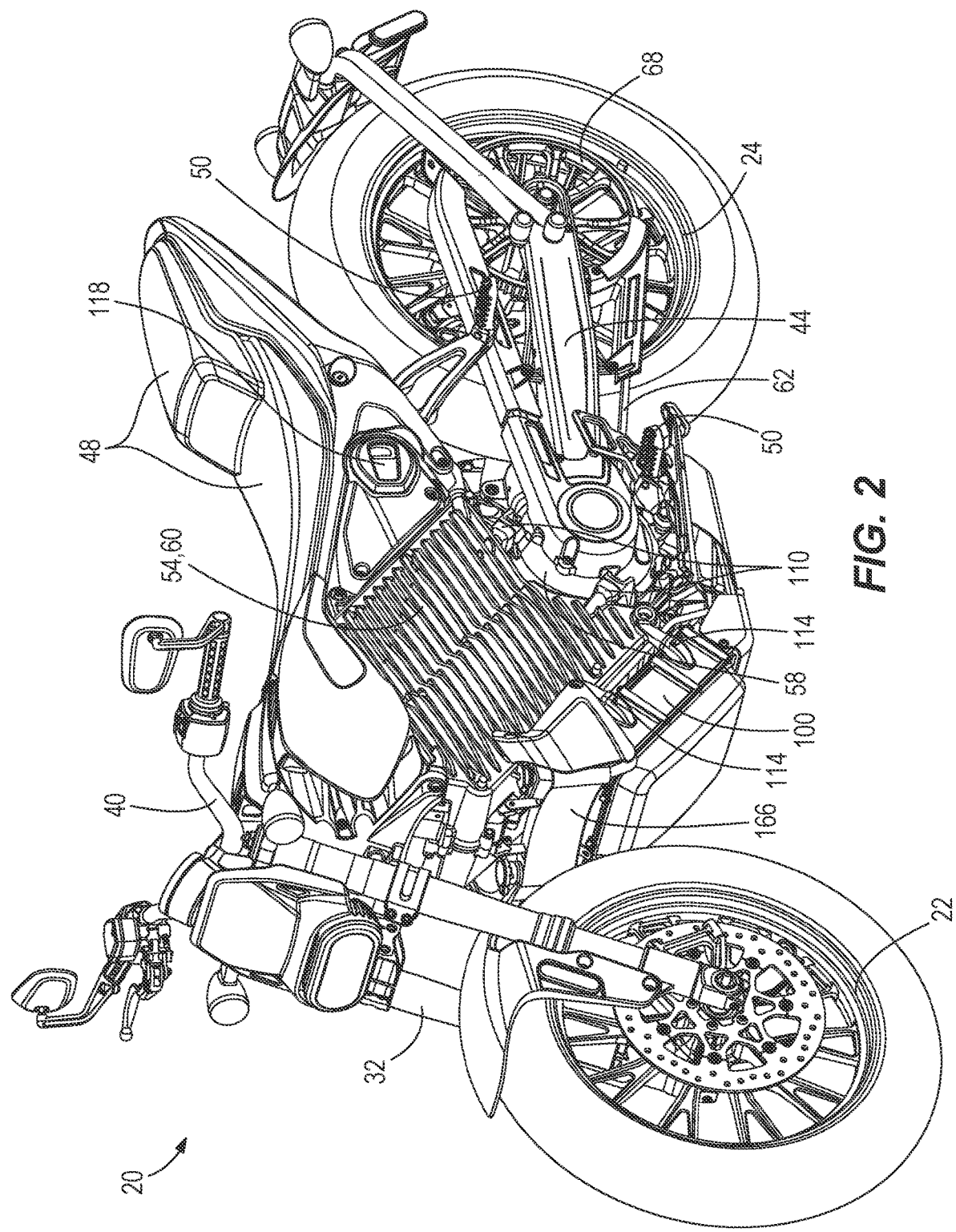
FIG. 2 is a left side perspective view of the motorcycle of FIG. 1.
Figure 3:
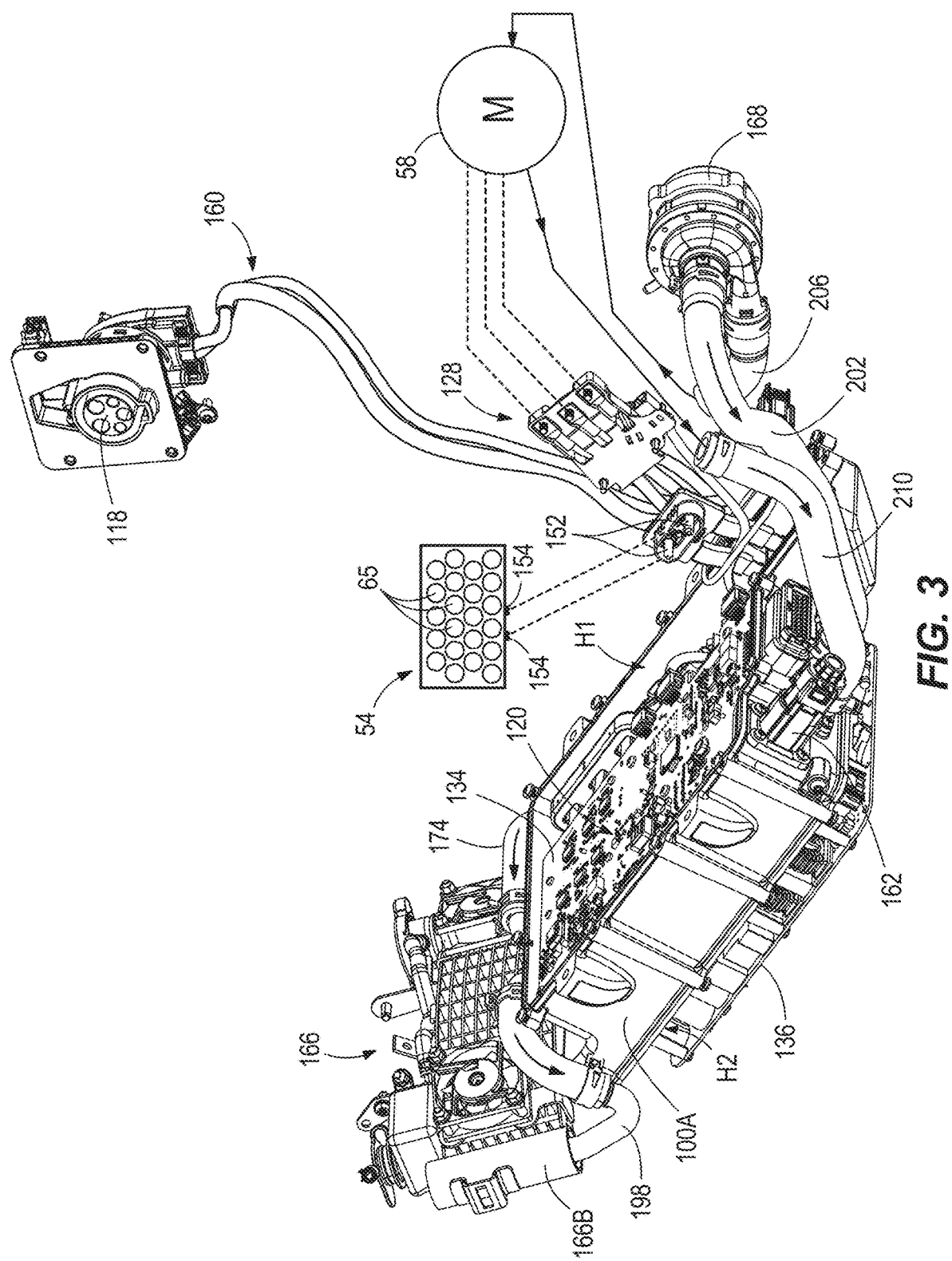
FIG. 3 is a perspective view of a portion of the motorcycle of FIG. 1, including a liquid-cooled power electronics housing, shown with covers removed.

As illustrated, the motorcycle 20 is an electric motorcycle operable to drive by an electric powertrain including a rechargeable energy storage system ("battery pack 54") and an electric motor 58 electrically coupled to the battery pack 54 to convert stored electrical energy from the battery pack 54 into rotational kinetic energy for driving the motorcycle 20. The battery pack 54 includes a hollow battery case 60 defining an internal cell cavity in which a plurality of rechargeable electrochemical cells 65 are received (FIG. 3). As illustrated, the motor 58 powers the rear wheel 24 through an endless drive member 62 (e.g., belt or chain) in the form of a loop wrapped around a drive sprocket 66 (FIG. 4) and a driven sprocket 68 that is fixedly secured to the rear wheel 24 (FIG. 2). In some constructions, the motorcycle 20 is provided without a multi-speed transmission, or without any gearbox whatsoever. This may further be facilitated by providing the electric motor 58 as a high pole count motor having high torque density. The electric motor 58 can be secured to one side of the battery case 60 (e.g., generally toward the bottom thereof) via a plurality of fastener joints 110, some of which are shown in FIG. 2. The motor 58 can have other configurations, as can the powertrain between the motor and the driven wheel(s) of the vehicle.

The motor 58 is energized with electrical power from the cells 65 of the battery pack 54 as supplied in a controlled manner through power electronics (e.g., including an inverter). The power electronics can be provided within a housing 100. The power electronics housing 100 is provided separately from the battery case 60 in the illustrated construction. The power electronics housing 100 can be positioned along a forward-facing side of the battery case 60 (and secured thereto via a plurality of fastener joints 114). Electrical connections between the battery pack 54, the electric motor 58, and the power electronics housing 100 can be established through one or more interior passageways, so as to avoid exposure to the surrounding environment. The power electronics housing 100 can be positioned adjacent a bottom end of the forward-facing side of the battery case 60 as shown. The power electronics housing 100 can contain one or any combination of: the inverter, the charger, and the DC/DC converter, among others. The components in the power electronics housing 100 generally constitute a power electronics controller operable to control the electrical power between the battery pack 54 and the motor 58, and also between the battery pack 54 and outside (grid) power selectively coupled for charging—particularly via connection with a charge port 118 of the motorcycle 20. The power electronics housing 100 can be provided by one or more individual pieces coupled together.

Figure 4:
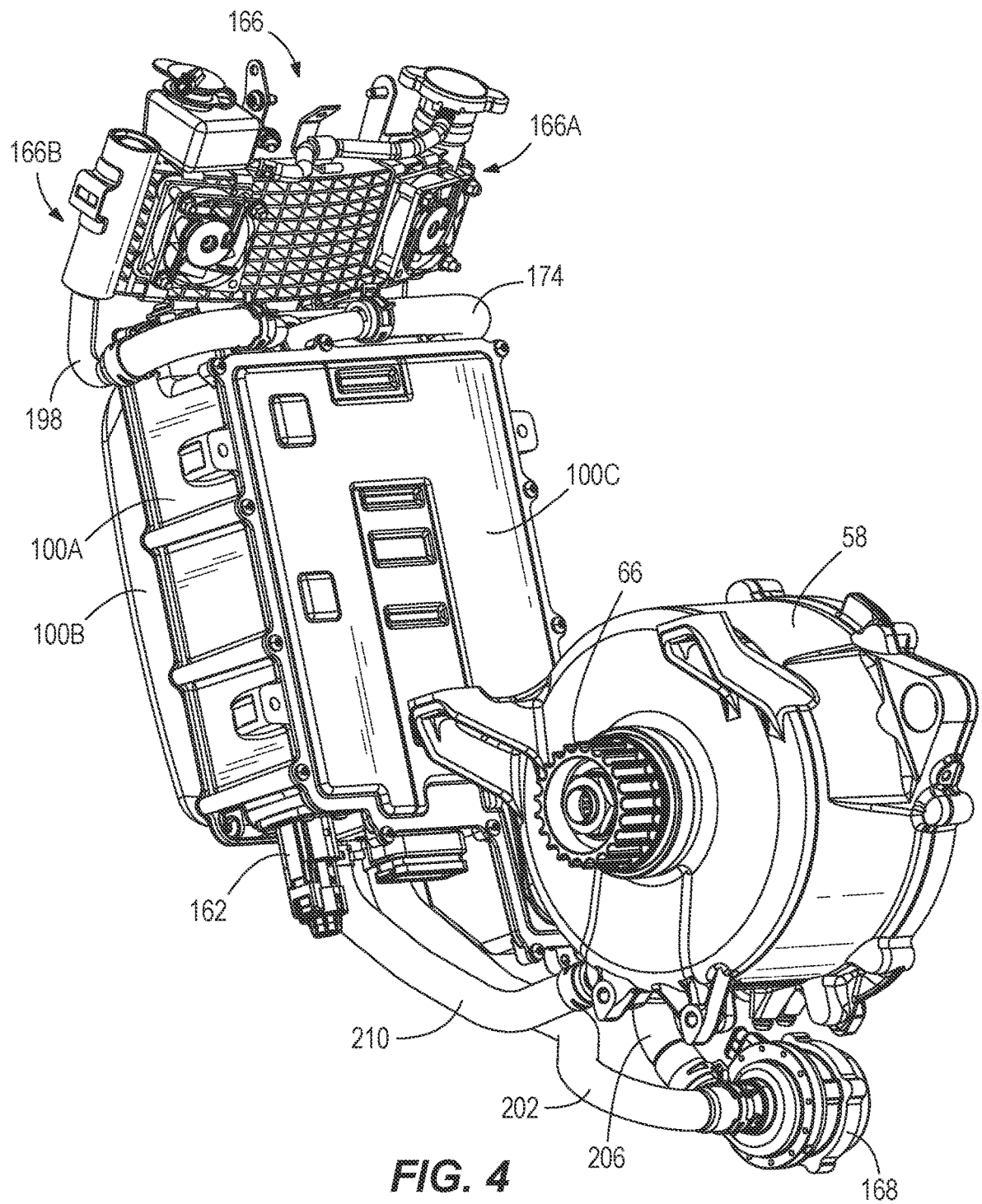
FIG. 4 is an alternate perspective view of the liquid-cooled power electronics housing, with the covers in place and connected to the electric traction motor.
Figure 6:
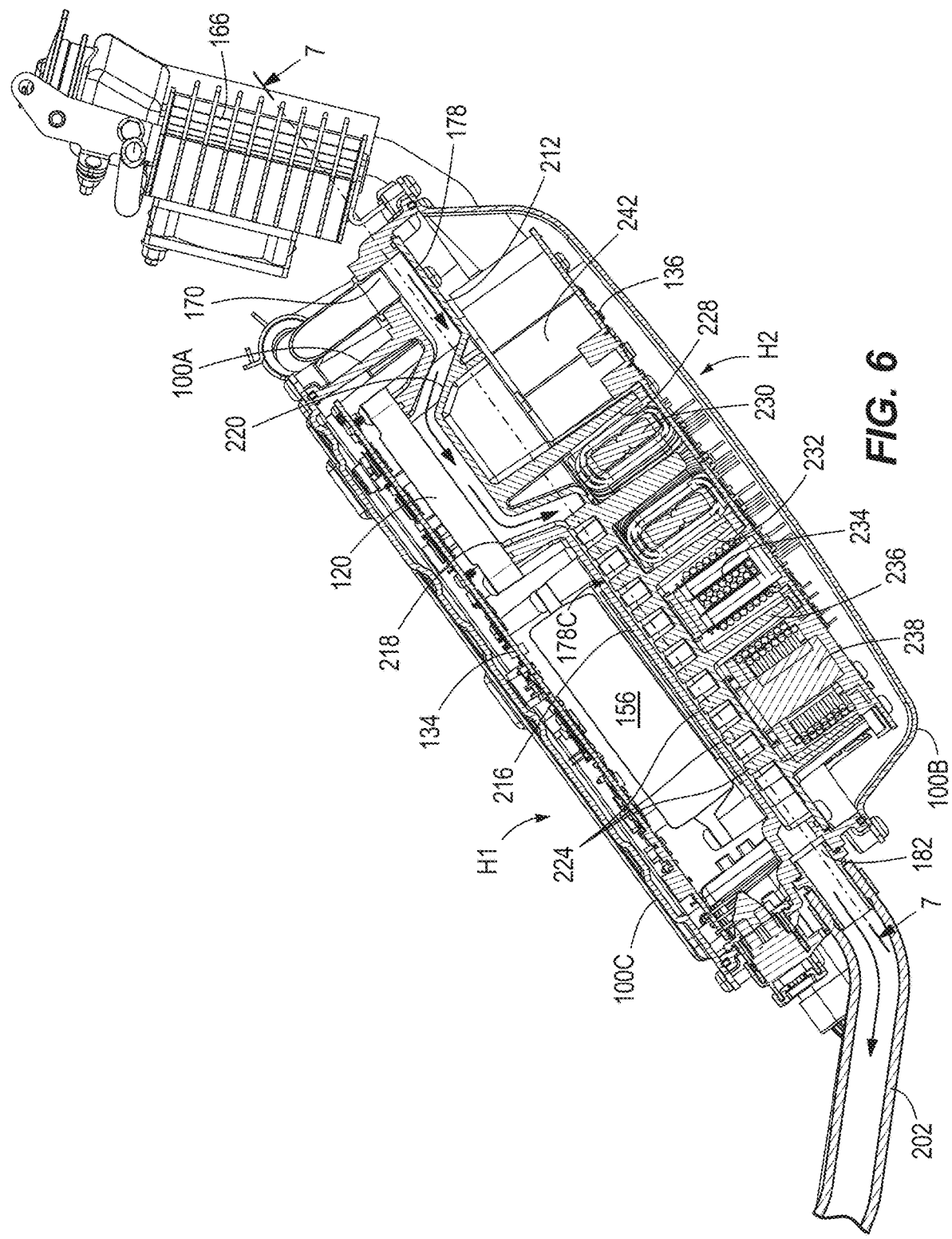
FIG. 6 is a cross-section view of the power electronics housing, taken along line 6-6 of FIG. 5.

The power electronics housing 100 can include multiple parts to form a power electronics housing assembly that encloses multiple electronic components—the housing and its contents providing a power electronics module. In particular, the power electronics housing assembly includes a main housing 100A and one or more covers 100B, 100C securable to the main housing 100A (FIG. 4). As illustrated, the main housing 100A is open on two opposite sides H1, H2 and forms an interior space in conjunction with a pair of opposed covers, including an outer cover 100B and an inner cover 100C. As described in further detail below, the power electronics housing 100 encloses a first circuit board 134 providing motor control (e.g., including an inverter power module or simply "inverter" 120, FIG. 3) and a second circuit board 136 providing charger control. The motor controller circuit board 134 and the charger circuit board 136 can be offset from each other as shown in FIGS. 3 and 6. In some constructions, the motor controller circuit board 134 and the charger circuit board 136 are parallel to each other. The motor controller circuit board 134 and the charger circuit board 136 are respectively positioned on the opposite sides H1, H2 of the main housing 100A. The motor controller circuit board 134 can be a single circuit board, or two or more boards, the overall combination of the board(s) and the connected electronic components providing a motor controller circuit for the traction motor 58. Similarly, the charger circuit board 136 can be a single circuit board, or two or more boards, the overall combination of the board(s) and the connected electronic components providing a charging circuit for the battery pack 54. The motorcycle 20 does not include any additional controller to drive the motor 58, nor any additional charger controller outside of the power electronics housing 100. Rather, controllers for driving the motor 58 and managing the charging of the battery pack 54 are contained entirely in the power electronics housing 100.

Returning to FIG. 3, the inverter 120 is provided on the motor controller circuit board 134 and configured for connection with a main power supply connection of the electric motor 58, shown schematically in FIG. 3. The inverter 120 can be constructed with a number of components on the circuit board 134 operable to supply a controlled driving current to the motor 58 (e.g., based upon the operator's request of a throttle control such as a twist grip). The motor 58 can include three terminals corresponding to three-phase AC supply from the inverter 120. As such, cables in the form of three AC motor leads 128 are provided for establishing the connection between the inverter 120 and the motor 58. The main power supply connection 124 and the connecting ends of the AC motor leads 128 are located in the space 106. Under conditions in which the motor 58 converts mechanical energy to electrical energy during regenerative braking, electrical power generated from the motor 58 is sent to the inverter 120 through the AC motor leads 128.

Electrical connection (DC) between the battery pack 54 and the power electronics housing 100 (electrical energy supply from the cells 65 to the inverter 120) is made, at least in part, by a pair of DC connections 152 (e.g., cables, bus bars, etc.) connecting the main high voltage leads 154 of the battery pack 54 to the inverter 120 through an inverter DC link capacitor 156 (FIG. 6). For charging, the motorcycle 20 includes the outward-facing charge port 118 for connection with an external charger and charge cable (not shown). From the charge port 118, the motorcycle 20 includes a charger connection cable 160 that connects with an AC charging input 162 of the power electronics housing 100. The AC charging input 162 is in turn connected internally to the charging circuit and the charger circuit board 136 thereof so as to provide a supply of charging current to the battery pack 54.

Figure 5:
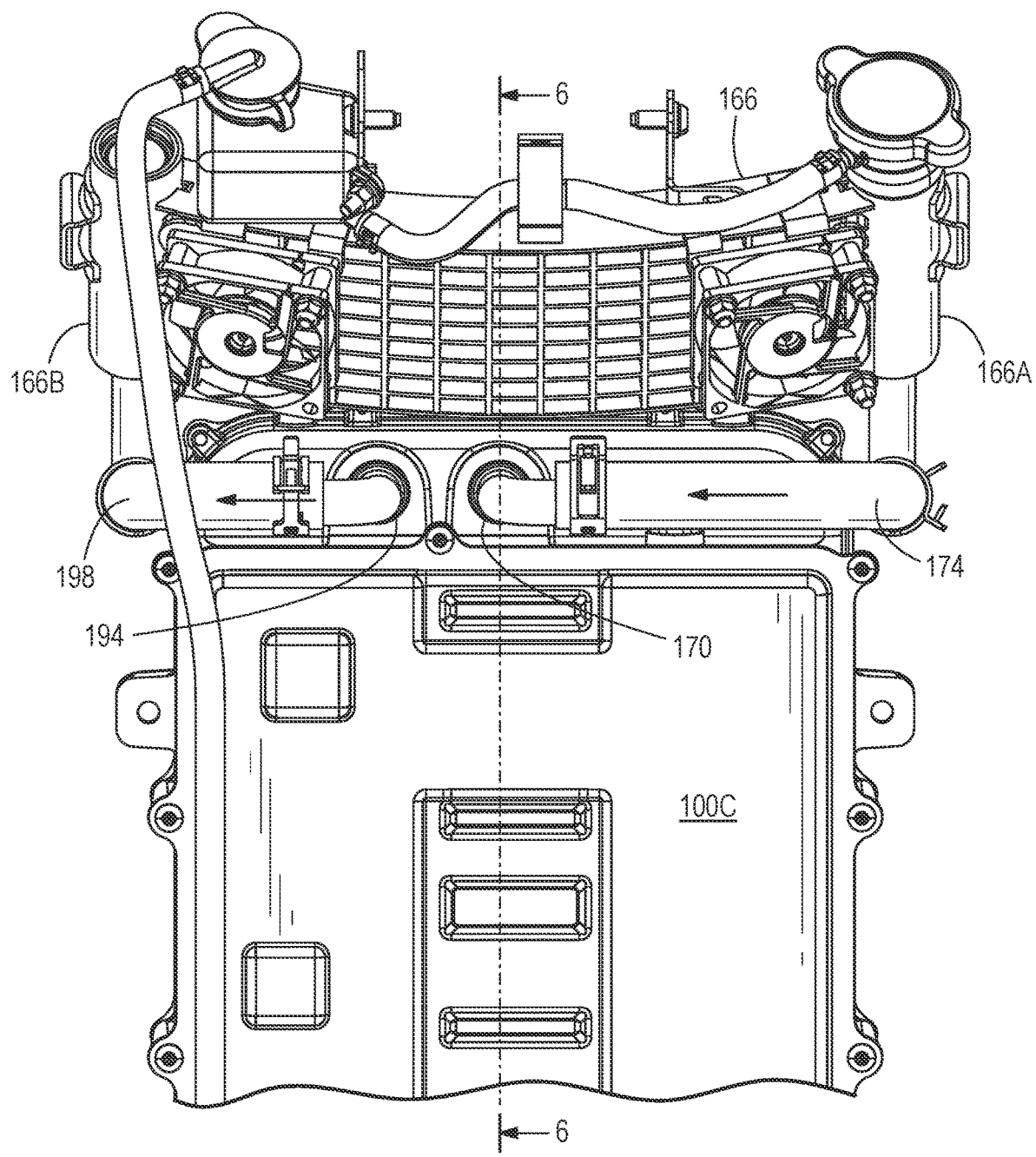
FIG. 5 is a rear view of a top portion of the liquid-cooled power electronics housing, illustrating radiator connections.

The electronics within the motor controller circuit and the charging circuit may generate heat during operation. In order to maintain suitable temperatures for normal operation, the power electronics module is liquid cooled, with a circulated flow of liquid coolant to draw heat from both the motor controller circuit and the charging circuit. Details of the coolant circuit of the illustrated construction are set forth in the following description. Elements of the liquid cooling circuit include the housing 100, a radiator 166 having an exposed area of finned coolant channels to radiate coolant heat out to the environment, and a coolant pump 168. Although the radiator 166 and the pump 168 are not illustrated as being in the housing 100, they can be considered part of the power electronics module as they provide the capacity for liquid cooling the components within the housing 100. As best illustrated in FIGS. 5 and 6, the radiator 166 can be mounted to the housing 100 (e.g., at a top end thereof) with brackets and/or fasteners, although additional mounting points for the radiator 166 may be separately provided. The radiator 166 has a cold or send side 166A and a hot or return side 166B, with the flow of coolant being directed through the finned coolant channels from the hot/return side 166B to the cold/send side 166A. The radiator 166 is situated on the vehicle to be exposed to oncoming traveling wind as shown in FIGS. 1 and 2.

The power electronics housing 100, particularly the main housing 100A, includes a first coolant inlet 170 connected to the cold/send side 166A of the radiator 166 to receive low temperature coolant that can absorb heat from electrical components of both the charging circuit and the motor controller circuit. The first coolant inlet 170 is connected to the cold/send side 166A of the radiator 166 by a conduit such as a flexible hose 174 and corresponding fittings, according to the illustrated embodiment or other alternatives thereof. The first coolant inlet 170 is configured to pass coolant from the radiator 166 into a cooling channel 178 formed within the housing 100. The cooling channel 178 is shown in the cross-sections of FIGS. 6 and 7. The coolant channel 178 extends generally lengthwise through the housing 100 from one end (e.g., top end adjacent the radiator 166) to an opposite end (e.g., bottom end remote from the radiator 166). At the second end of the housing 100, a first coolant outlet 182 is provided to pass coolant from the cooling channel 178 out of the housing 100 to an external cooling loop prior to returning to the housing 100 at a return or second inlet 186. As described below, the external cooling loop can include one or more additional components to be cooled by the coolant prior to its return to the hot/return side 166B of the radiator 166. Coolant returned to the second inlet 186 is configured to flow through a hot coolant return passage 190 (FIG. 7) of the housing 100 to a second coolant outlet 194. The second coolant outlet 194 is connected to the hot/return side 166B of the radiator 166 by a conduit such as a flexible hose 198 and corresponding fittings, according to the illustrated embodiment or other alternatives thereof.

In the illustrated construction, the external cooling loop includes the coolant pump 168 and the electric motor 58. The pump 168 has an inlet connected to the first coolant outlet 182 by a conduit such as a flexible hose 202 and corresponding fittings, according to the illustrated embodiment or other alternatives thereof. From an outlet of the pump 168, the coolant is directed to a cooling channel (e.g., internal cooling passages or a cooling jacket) of the motor 58. The pump outlet is connected to the motor's coolant inlet by a conduit such as a flexible hose 206 and corresponding fittings, according to the illustrated embodiment or other alternatives thereof. A conduit such as a flexible hose 210 and corresponding fittings, according to the illustrated embodiment or other alternatives thereof, is provided to route the coolant from a coolant outlet of the motor 58 back to the return or second inlet 186 of the housing 100. The external cooling loop, formed in the illustrated construction by the pump 168 and the motor 58, is downstream of the cooling channel 178 in the housing 100 with respect to the supply of the lowest temperature coolant supplied from the radiator cold/send side 166A. Thus, the power electronics associated with both motor control and charging are effectively prioritized (and between these two, the inverter 120 of the motor control electronics can be prioritized).

Figure 7:
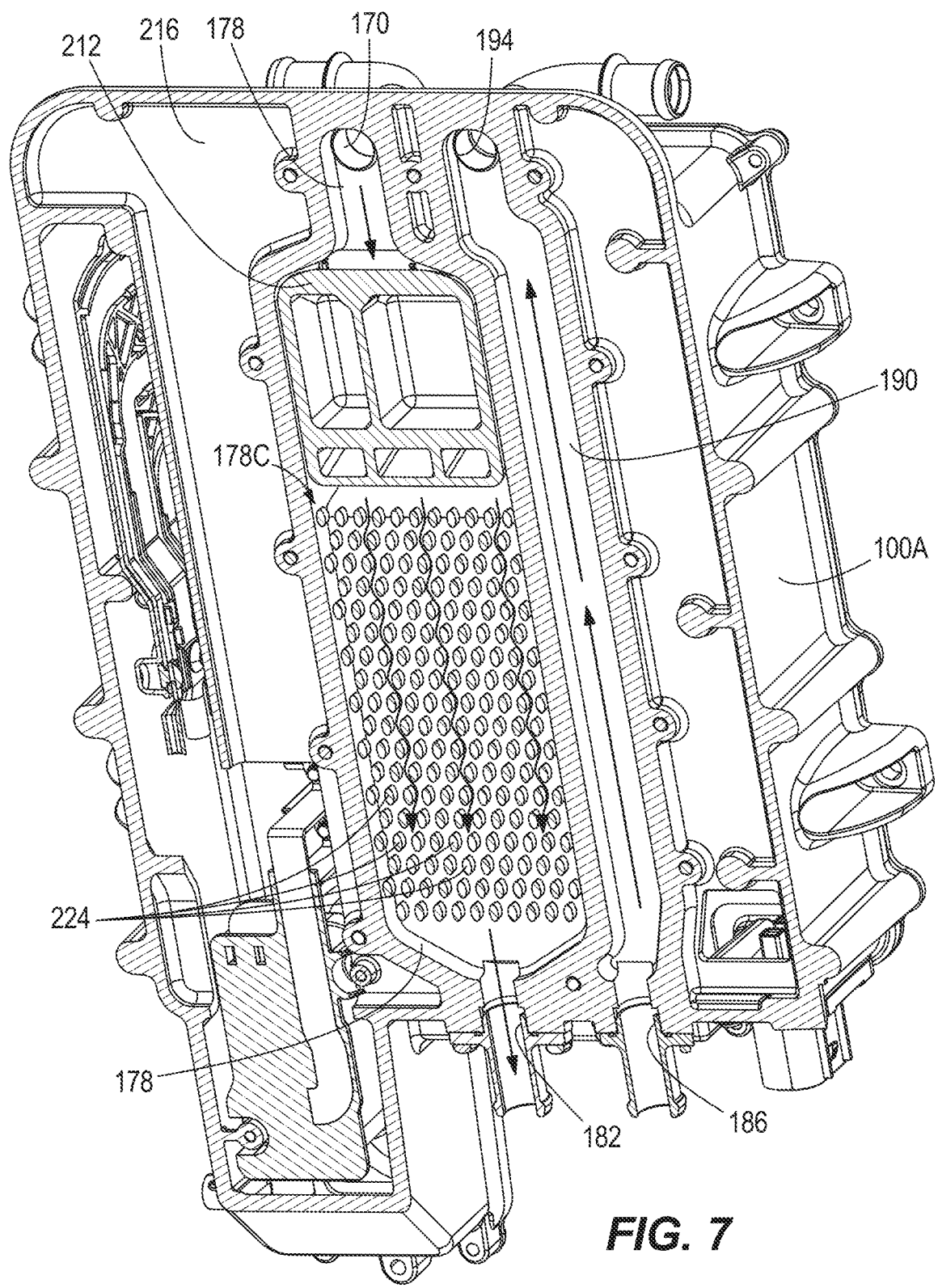
FIG. 7 is cross-section view of the power electronics housing, taken along line 7-7 of FIG. 6.

Looking to the interior of the power electronics housing 100 as shown in FIGS. 6 and 7, the cooling channel 178 is formed cooperatively by a cooling plate 212 and a dividing wall 216 of the main housing 100A. The main housing 100A is divided by the dividing wall 216 into a first side H1 accommodating the components of the motor controller circuit and a second side H2 accommodating the components of the charger circuit. The cooling plate 212 is situated on the second side H2 of the dividing wall 216 with the components of the charger circuit. The cooling plate 212 can have a perimeter that lies wholly within a perimeter of the main housing 100A as shown in FIG. 7. The cooling plate 212 can be secured to the dividing wall 216, the securement provided by a plurality of fasteners and/or a sealer/gasket. The cooling channel 178 has a portion positioned along the inverter 120 of the motor controller circuit, and the cooling channel 178 has another portion (e.g., further from the first coolant inlet 170) positioned along the plurality of electronic components of the charger circuit. In fact, the dividing wall 216 can include an opening 218 between the two sides H1, H2, the opening 218 being closed by the inverter 120 such that, at this localized area, the cooling channel 178 is formed on one side by the cooling plate 212 and on the other side by the inverter 120 (e.g., a casing or housing in which the inverter switches are provided-such as insulated-gate bipolar transistors (IGBT)). As shown in FIG. 7, the main housing 100A alone, without the cooling plate 212, defines the hot coolant return passage 190 between the second coolant inlet 186 and the second coolant outlet 194.

During operation, the "low temperature coolant"—the coolant with the lowest temperature in the coolant circuit—leaves the radiator cold side 166A and flows into the first coolant inlet 170. This and all other movement of all the coolant in the circuit is driven by the pump 168. Upon entering the housing 100 at the first coolant inlet 170, the coolant encounters an angled surface of the cooling plate 212 forming a ramp 220 that directs the coolant away from the second side H2 or the charger side and toward the first side H1 or the motor controller side, particularly toward the inverter 120. At the end of the ramp 220, the cooling channel 178 extends along the inverter 120. The coolant may be directly exposed to the inverter 120 through the dividing wall opening 218 as mentioned above. Past the inverter 120, the cooling channel 178 extends into a second portion, or charger circuit portion 178C, configured to absorb heat from the components of the charger circuit. In the charger circuit portion 178C, the cooling plate 212 includes an array of cooling fins 224 within the cooling channel 178. As illustrated, the cooling fins 224 are provided as pins with round cross-section. The cooling fins 224 can take a number of different structures that project into the cooling channel 178 to provide an increased amount of surface area contact for the coolant along the cooling plate 212. Opposite the fins 224, the cooling plate 212 can include one or more mounting areas, such as pockets, receiving the charger circuit electronics. As shown, the cooling plate 212 includes a first pocket 228 receiving a charger inductor 230, a second pocket 232 receiving charger magnetic components 234, and a third pocket 236 receiving a transformer 238. Charger capacitors 242 are provided outside the finned area of the cooling plate 212 (e.g., in the area where the cooling plate 212 is ramped toward the inverter 120).

As will be appreciated from the preceding description as well as the drawings of the present application, the cooling channel 178 and the cooling plate 212 are sandwiched between two different groups of electronics to be cooled. The cooling plate 212 has only one "wet" side along which the liquid coolant flows. This is the side facing the first circuit board 134 providing motor control, also the side which cooperates to define the cooling channel 178. The opposite side of the cooling plate 212 that faces the second circuit board 136 providing charger control is a "dry" side not exposed to the liquid coolant. Thus, the inverter 120 is cooled by forced convection through a direct heat transfer path to the liquid coolant. On the other hand, the cooling plate 212 acts as an intermediate heat sink for the charger electronics, with heat being transferred from the charger electronics to the cooling plate 212 and then by conduction through the cooling plate 212 to those surfaces in contact with the liquid coolant in the cooling channel 178. In some constructions, the cooling plate 212 is formed of aluminum (e.g., a solid aluminum piece formed by casting and/or machining to include the features disclosed herein).

Various features and advantages of the invention are set forth in the following claims.

What is claimed is:

1. A power electronics module for an electric vehicle, the power electronics module comprising:
    a housing;
    a charger circuit including a circuit board with a plurality of electronic components on a first side of the housing, the charger circuit including an AC input and a DC output;
    a motor controller circuit including a circuit board with a plurality of electronic components on a second side of the housing, the motor controller circuit including a DC input, an inverter, and an AC output;
    a cooling plate provided in the housing, the cooling plate being sandwiched between the inverter of the motor controller circuit on a first side of the cooling plate and the plurality of electronic components of the charger circuit on a second side of the cooling plate opposite the first side; and
    a cooling channel extending through the housing to direct a flow of liquid coolant through a portion of the cooling channel positioned along the inverter of the motor controller circuit and through a separate portion of the cooling channel positioned along the plurality of electronic components of the charger circuit,
    wherein the housing includes a main housing including a dividing wall dividing the first side of the housing from the second side of the housing, the first and second sides being selectively closed by respective covers to create a first enclosed space for the charger circuit and a second enclosed space for the motor controller circuit,
    wherein the dividing wall and the cooling plate cooperate to create the cooling channel, and
    wherein the dividing wall has an opening in which the inverter is directly exposed to the cooling channel.

2. The power electronics module of claim 1, further comprising a radiator configured to supply coolant to an inlet of the housing, wherein the portion of the cooling channel positioned along the inverter is nearer the inlet than the separate portion positioned along the plurality of electronic components of the charger circuit.

3. The power electronics module of claim 1, wherein the housing includes a first coolant inlet configured to pass coolant from a radiator into the cooling channel, and a first coolant outlet configured to pass coolant from the cooling channel out of the housing to an external cooling loop, and wherein the housing further includes a second coolant inlet configured to receive coolant from the external cooling loop, and a second coolant outlet configured to return coolant to the radiator.

4. The power electronics module of claim 3, wherein the main housing alone, without the cooling plate, defines a hot coolant return passage between the second coolant inlet and the second coolant outlet.

5. The power electronics module of claim 1, wherein the cooling plate includes a ramp portion extending the cooling channel toward the circuit board of the motor controller circuit.

6. The power electronics module of claim 1, wherein the cooling plate includes an array of cooling fins extending into the cooling channel along a charger circuit portion of the cooling plate.

7. The power electronics module of claim 6, wherein the cooling plate includes a plurality of mounting areas receiving the plurality of electronic components of the charger circuit.

8. The power electronics module of claim 7, wherein plurality of electronic components of the charger circuit comprises a transformer and a charger inductor.

9. A power electronics module for an electric vehicle, the power electronics module comprising:
    a housing;
    a charger circuit including a circuit board with a plurality of electronic components on a first side of the housing, the charger circuit including an AC input and a DC output;
    a motor controller circuit including a circuit board with a plurality of electronic components on a second side of the housing, the motor controller circuit including a DC input, an inverter, and an AC output; and
    a cooling plate provided in the housing, the cooling plate being sandwiched between the inverter of the motor controller circuit on a first side of the cooling plate and the plurality of electronic components of the charger circuit on a second side of the cooling plate opposite the first side,
    wherein the housing includes a main housing including a dividing wall dividing the first side of the housing from the second side of the housing, the first and second sides being selectively closed by respective covers to create a first enclosed space for the charger circuit and a second enclosed space for the motor controller circuit,
    wherein the dividing wall and the cooling plate cooperate to create a cooling channel for liquid coolant, the cooling channel having a portion positioned along the inverter of the motor controller circuit, and the cooling channel having another portion positioned along the plurality of electronic components of the charger circuit, and
    wherein the housing includes
        a first coolant inlet configured to pass coolant from a radiator into the cooling channel,
        a first coolant outlet configured to pass coolant from the cooling channel out of the housing to an external cooling loop,
        a second coolant inlet configured to receive coolant from the external cooling loop, and
        a second coolant outlet configured to return coolant to the radiator.

10. The power electronics module of claim 9, wherein the main housing alone, without the cooling plate, defines a hot coolant return passage between the second coolant inlet and the second coolant outlet.

* * * * *